(12) United States Patent
Lee et al.

(10) Patent No.: US 11,908,887 B2
(45) Date of Patent: Feb. 20, 2024

(54) CAPACITOR AND SEMICONDUCTOR DEVICE INCLUDING THE SAME

(71) Applicant: Samsung Electronics Co., Ltd., Suwon-si (KR)

(72) Inventors: Jaeho Lee, Seoul (KR); Boeun Park, Hwaseong-si (KR); Younggeun Park, Suwon-si (KR); Jooho Lee, Hwaseong-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 213 days.

(21) Appl. No.: 17/307,592

(22) Filed: May 4, 2021

(65) Prior Publication Data
US 2022/0140066 A1 May 5, 2022

(30) Foreign Application Priority Data
Oct. 29, 2020 (KR) .......................... 10-2020-0142528

(51) Int. Cl.
*H10B 53/00* (2023.01)
*H01L 49/02* (2006.01)

(52) U.S. Cl.
CPC .............. *H01L 28/56* (2013.01); *H01L 28/75* (2013.01); *H10B 53/00* (2023.02)

(58) Field of Classification Search
CPC ......... H01L 28/56; H01L 23/66; H01L 28/75; H01L 2223/6661; H01L 21/02175; H01L 21/02197; H01L 27/11502; H01G 4/06; H01G 4/10; H01G 4/30
See application file for complete search history.

(56) References Cited

U.S. PATENT DOCUMENTS

| | | | | |
|---|---|---|---|---|
| 4,437,139 A | * | 3/1984 | Howard | .................. H01L 28/40 204/192.15 |
| 6,184,044 B1 | * | 2/2001 | Sone | ................. H01L 21/02274 257/E21.01 |
| 7,297,591 B2 | | 11/2007 | Won et al. | |
| 7,799,631 B2 | | 9/2010 | Park | |
| 2004/0113186 A1 | * | 6/2004 | Karasawa | ......... H01L 21/02197 257/295 |
| 2016/0268048 A1 | * | 9/2016 | Zelner | .................... H01G 4/012 |
| 2018/0247997 A1 | * | 8/2018 | Zelner | .................... H01L 28/40 |
| 2019/0042948 A1 | | 2/2019 | Lee et al. | |
| 2019/0165087 A1 | * | 5/2019 | Kim | ..................... H01G 4/1263 |
| 2019/0318774 A1 | * | 10/2019 | Kittl | ........................ H01L 28/56 |
| 2020/0020780 A1 | * | 1/2020 | Kim | ........................ H01L 29/94 |

(Continued)

FOREIGN PATENT DOCUMENTS

| | | |
|---|---|---|
| KR | 10-0493040 | 6/2005 |
| KR | 10-0818657 | 4/2008 |

(Continued)

*Primary Examiner* — Ahmed N Sefer
(74) *Attorney, Agent, or Firm* — Harness, Dickey & Pierce, P.L.C.

(57) ABSTRACT

Provided are a capacitor and a semiconductor device including the capacitor. The capacitor includes a first electrode; a plurality of dielectric films on the first electrode in a sequential series, the plurality of dielectric layers having different conductances from each other; and a second electrode on the plurality of dielectric films, wherein the capacitor has a capacitance which converges to a capacitance of one of the plurality of dielectric films.

17 Claims, 7 Drawing Sheets

(56) References Cited

U.S. PATENT DOCUMENTS

| | | | |
|---|---|---|---|
| 2020/0105533 A1* | 4/2020 | Chen | H01L 29/66545 |
| 2020/0168717 A1* | 5/2020 | Kim | H01L 29/4966 |
| 2020/0243531 A1 | 7/2020 | Ahn et al. | |
| 2021/0066446 A1* | 3/2021 | Lee | H01L 28/75 |
| 2021/0242225 A1* | 8/2021 | Manfrini | H01L 29/516 |
| 2021/0328004 A1* | 10/2021 | Lee | H01G 4/10 |
| 2021/0359082 A1* | 11/2021 | Kang | H01L 28/56 |
| 2021/0359100 A1* | 11/2021 | Maeng | H01L 27/11502 |
| 2022/0416012 A1* | 12/2022 | Wang | H01L 28/56 |

FOREIGN PATENT DOCUMENTS

| | | |
|---|---|---|
| KR | 10-2014-0004855 A | 1/2014 |
| KR | 101752546 B1 | 6/2017 |
| KR | 10-2017-0136826 A | 12/2017 |
| KR | 10-2019-0014900 A | 2/2019 |
| KR | 10-2021-0130040 A | 10/2021 |

\* cited by examiner

| Total/L₃ [Å] | Ratio |
|---|---|
| 60/35 | 131.0 |
| 60/40 | 145.5 |
| 48/35 | 104.8 |
| 48/40 | 116.3 |

CAPACITOR AND SEMICONDUCTOR DEVICE INCLUDING THE SAME

CROSS-REFERENCE TO RELATED APPLICATION

This application is based on and claims priority under 35 U.S.C. § 119 to Korean Patent Application No. 10-2020-0142528, filed on Oct. 29, 2020, in the Korean Intellectual Property Office, the disclosure of which is incorporated by reference herein in its entirety.

BACKGROUND

1. Field

The present disclosure relates to capacitors and semiconductor devices.

2. Description of Related Art

The available space occupied by capacitors in integrated circuit devices is also decreasing with the down-scaling of integrated circuit devices. The capacitor includes upper and lower electrodes and a dielectric film between the upper and lower electrodes, and a dielectric material having a high dielectric constant is used to exhibit high capacitance. A leakage current may also flow in the capacitor. There is a need to develop a technique for minimizing the decrease in capacitance while reducing a leakage current flowing in the capacitor.

SUMMARY

Provided are capacitors having high leakage current blocking characteristics and high capacitance.

Provided are semiconductor devices including a capacitor having high leakage current blocking characteristics and high capacitance.

However, the problem to be solved is not limited to the above disclosure.

Additional aspects will be set forth in part in the description which follows and, in part, will be apparent from the description, or may be learned by practice of the presented embodiments of the disclosure.

According to an embodiment, a capacitor includes: a first electrode; a plurality of dielectric films on the first electrode in a sequential series, the plurality of dielectric layers having different conductances from each other; and a second electrode on the plurality of dielectric films, wherein the capacitor has a capacitance which converges to a capacitance of one of the plurality of dielectric films.

The capacitance of the capacitor may converge to a capacitance of a dielectric film having the smallest conductance among the plurality of dielectric films.

Also, a difference in capacitance between the capacitance of the capacitor and the capacitance of a dielectric film having the smallest conductance among the plurality of dielectric films may be less than a difference in capacitance between the capacitance of the capacitor and the capacitances of at least one of a remainder of the dielectric films.

A dielectric constant of the dielectric film having the smallest conductance among the plurality of dielectric films is greater than the dielectric constant of at least one of a remainder remaining dielectric films.

Also, the dielectric constant of the dielectric film having the smallest conductance among the plurality dielectric films may be 30 or more.

Among the plurality of dielectric films, a dielectric film having the smallest conductance may include at least one of a perovskite structure, a ferroelectric material, a paraelectric material, or an antiferroelectric material.

Also, the capacitance of the capacitor may be greater 10% or more than the capacitance of the dielectric film having the smallest conductance among the plurality of dielectric films.

Also, a thickness of a dielectric film having the smallest conductance, among the plurality of dielectrics, has a greater effect on the capacitance of the capacitor than a thickness of a dielectric film having the largest conductance among the plurality of dielectric films.

A thickness of a dielectric film having the smallest conductance among the plurality of dielectric films may be 4 nm or less.

Also, a thickness of a dielectric film having a largest conductance among the plurality of films may be 2 nm or less.

The thickness of the capacitor may be 5 nm or less.

Also, a difference in conductance between two of the plurality of dielectric films may be 10 times or more.

A difference in conductance between a dielectric film having a largest conductance and a dielectric film having a smallest conductance, among the plurality of dielectric films, is 100 times or more.

Also, the capacitor may further include a first insertion film, wherein the plurality of wherein the plurality of dielectric films include a first, second, and third dielectric film, and the first insertion film is between the second and the third dielectric films.

The second and the third dielectric films may directly contact the first insertion film.

Also, a thickness of the first insertion film may be less than twice a thickness of an atomic layer included in the first insertion film.

The second and the third dielectric films may include the same material.

Also, the first and second dielectric films may be in direct contact and may include different materials from each other.

The capacitor may further include a second insertion film between the first and the second dielectric films.

According to an embodiment, a semiconductor device may include a transistor and a capacitor, as described above, electrically connected to the transistor.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Figure 1:
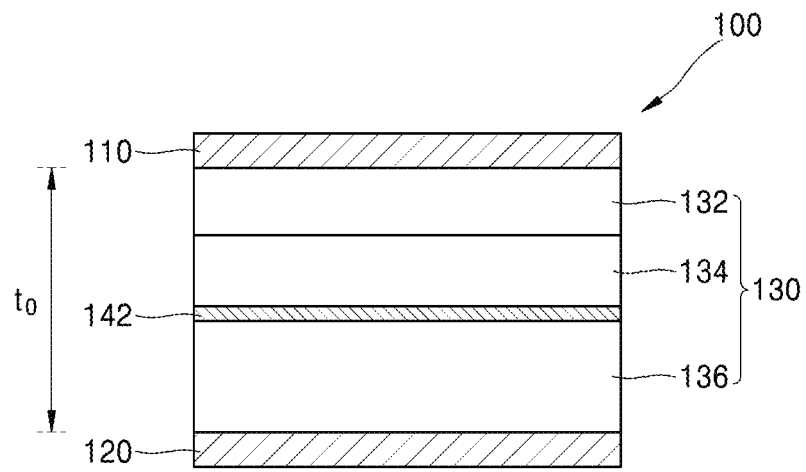
FIG. 1 is a cross-sectional view of a capacitor according to some embodiments.

Reference will now be made in detail to some example embodiments, examples of which are illustrated in the accompanying drawings, wherein like reference numerals refer to like elements throughout, and sizes of elements may be exaggerated for clarity and convenience of explanation. The example embodiments of the inventive concepts are capable of various modifications and may be embodied in many different forms. In this regard, the present embodiments may have different forms and should not be construed as being limited to the descriptions set forth herein. Accordingly, the example embodiments are merely described below, by referring to the figures, to explain aspects. As used herein, the term "and/or" includes any and all combinations of one or more of the associated listed items. Expressions such as "at least one of," when preceding a list of elements, modify the entire list of elements and do not modify the individual elements of the list.

Although the terms "first," "second," "third," etc., may be used herein to describe various elements, components, regions, layers, and/or sections, these elements, components, regions, layers, and/or sections, should not be limited by these terms. These terms are only used to distinguish one element, component, region, layer, or section, from another region, layer, or section. Thus, a first element, component, region, layer, or section, discussed below may be termed a second element, component, region, layer, or section, without departing from the scope of this disclosure.

When the terms "about" or "substantially" are used in this specification in connection with a numerical value, it is intended that the associated numerical value includes a manufacturing tolerance (e.g., ±10%) around the stated numerical value. Further, regardless of whether numerical values or shapes are modified as "about" or "substantially," it will be understood that these values and shapes should be construed as including a manufacturing or operational tolerance (e.g., ±10%) around the stated numerical values or shapes.

It will be understood that the spatially relative terms are intended to encompass different orientations of the device in use or operation in addition to the orientation depicted in the figures. For example, if the device in the figures is turned over, elements described as "lower," other elements or features would then be oriented "above" the other elements or features. For example, the device may be otherwise oriented (rotated 90 degrees or at other orientations) and the spatially relative descriptors used herein interpreted accordingly. It will be understood that when an element or layer is referred to as being "on" or "above" another element or layer, the element or layer may be directly on another element or layer or intervening elements or layers.

The singular forms are intended to include the plural forms as well, unless the context clearly indicates otherwise. It should be understood that, when a part "comprises" or "includes" an element in the specification, unless otherwise defined, other elements are not excluded from the part and the part may further include other elements.

FIG. 1 is a cross-sectional view of a capacitor 100 according to some embodiments.

Referring to FIG. 1, a capacitor 100 includes a first electrode 110 and a second electrode 120 that are separated from each other, and a dielectric layer 130 between the first electrode 110 and the second electrode 120. The first electrode 110, the dielectric layer 130, and the second electrode 120 may be sequentially arranged. For example, one of the first electrode 110 and/or the second electrode 120 may be a lower electrode of the capacitor 100, and the other may be an upper electrode of the capacitor 100. The dielectric layer 130 may include first to third dielectric films 132, 134, and 136 that are sequentially arranged. Each of the first to third dielectric films 132, 134, and 136 may also include a plurality of sub dielectric films.

The first electrode 110 and the second electrode 120 may include conductive material. For example, the conductive material may comprise at least one of a metal, a metal nitride, a metal oxide, and/or a combination thereof. For example, at least one of the first electrode 110 and the second electrode 120 may include TiN, MoN, CoN, TaN, W, Ru, $RuO_2$, $SrRuO_3$, Ir, $IrO_2$, Pt, PtO, $SrRuO_3$(SRO), (Ba, Sr)$RuO_3$ (BSRO), $CaRuO_3$ (CRO), (La, Sr)$CoO_3$ (LSCO), and/or a combination thereof.

The physical properties of the first to third dielectric films 132, 134, and 136 may be different from each other. For example, the first to third dielectric films 132, 134, and 136 may have conductance and capacitance characteristics different from each other. In some embodiments, at least two of the first to third dielectric films 132, 134, and 136 may include materials different from each other. For example, the first dielectric film 132 and the second dielectric film 134 may include materials different from each other, and the second dielectric film 134 may include the same material as the third dielectric film 136, but the present embodiment is not limited thereto. In some embodiments, the first to third dielectric films 132, 134, and 136 may include the same material, but may have physical properties different from each other. For example, if the first to third dielectric films 132, 134, and 136 include the same material, physical properties (for example, conductance, capacitance, etc.) may vary depending on the crystal structure.

At least one of the first to third dielectric films 132, 134, and 136 may include a material having a high dielectric constant. For example, the material may be a high-k dielectric, and/or may have a dielectric constant greater than silicon dioxide. At least one of the first to third dielectric films 132, 134, and 136 may use a metal oxide including at least one metal selected from Ca, Sr, Ba, Sc, Y, La, Ti, Hf, Zr, Nb, Ta, Ce, Pr, Nd, Gd, Dy, Yb, and/or Lu. For example, at least one of the first to third dielectric films 132, 134, and 136 may include at least one of $HfO_2$, $ZrO_2$, $CeO_2$, $La_2O_3$, $Ta_2O_3$, and/or $TiO_2$.

At least one of the first to third dielectric films 132, 134, and 136 may include a ferroelectric material, a paraelectric material, and/or an antiferroelectric material. In an example, at least one of the first to third dielectric films 132, 134, and 136 may include a dielectric material having a non-perovskite structure and/or a perovskite structure. In some embodiments, one of the first to third dielectric films 132, 134, and 136 may include a non-perovskite structure, and another of the first to third dielectric films 132, 134, and 136 may include a perovskite structure. The dielectric material having a non-perovskite structure may include a metal oxide layer including a metal, such as hafnium (Hf), zirconium (Zr), niobium (Nb), and/or aluminum (Al). As an example, the dielectric material having a perovskite structure may include a dielectric material having an $ABO_3$ series structure. In $ABO_3$, 'A' may be, for example, strontium (Sr), barium (Ba), bismuth (Bi) and/or lanthanum (La); and 'B' may be, for example, titanium (Ti), tantalum (Ta), ruthenium (Ru), hafnium (Hf), zirconium (Zr), and/or molybdenum (Mo).

The capacitor 100 may further include an insertion film 142 in the dielectric layer 130. The insertion film 142 may include a dielectric material having a dielectric constant lower than that of the first to third dielectric films 132, 134, and 136, and/or may have a very small thickness. Thus, the insertion film 142 may not operate as a constituent layer of the capacitor 100. For example, the insertion film 142 may have a thickness less film twice the thickness of the atomic layer of the material included in the insertion film 142. For example, the insertion film 142 may be a single layer and/or twice an atomic layer. Alternatively, the insertion film 142 may be 7 Å or less.

The insertion film 142 may be an oxide. For example, the insertion film 142 may include $Al_2O_3$, but is not limited thereto.

The insertion film 142 may block a leakage current between the adjacent dielectric films (e.g., the second and third dielectric film 134 and 136) and may induce the change of physical properties of the adjacent dielectric films (e.g., the second and third dielectric film 134 and 136). For example, when the insertion film 142 is arranged between the second dielectric film 134 and the third dielectric film 136, the insertion film 142 may induce a change in the physical properties. For example, the insertion film 142 may affect the crystal structure in and/or induce a crystallinity change of the second dielectric film 134. Thus, even if the second dielectric film 134 and the third dielectric film 136 include the same material, because the third dielectric film 136 is stacked on the second electrode 120 and the second dielectric film 134 is stacked on the insertion film 142, the physical properties (for example, capacitance and/or conductance) may vary. Thus, the use of the insertion film 142 may allow the second and third dielectric films 134 and 136 to include the same material, thereby facilitating the manufacture of the capacitor 100.

The thickness of the capacitor 100 may be the same as the separation distance between the first electrode 110 and the second electrode 120. As the degree of integration of an integrated circuit device including the capacitor 100 increases, a space occupied by the capacitor 100 decreases. The thickness of the capacitor 100 according to some embodiments may be about 5 nm or less. Alternatively, the thickness of the capacitor 100 may be about 5 nm or less.

As the thickness of the capacitor 100 decreases, the dielectric layer 130 may have conductance due to a leakage current. Thus, the capacitance of the capacitor 100 may be affected not only by the capacitances of the first to third dielectric films 132, 134, and 136; but also the conductance.

Figure 2:
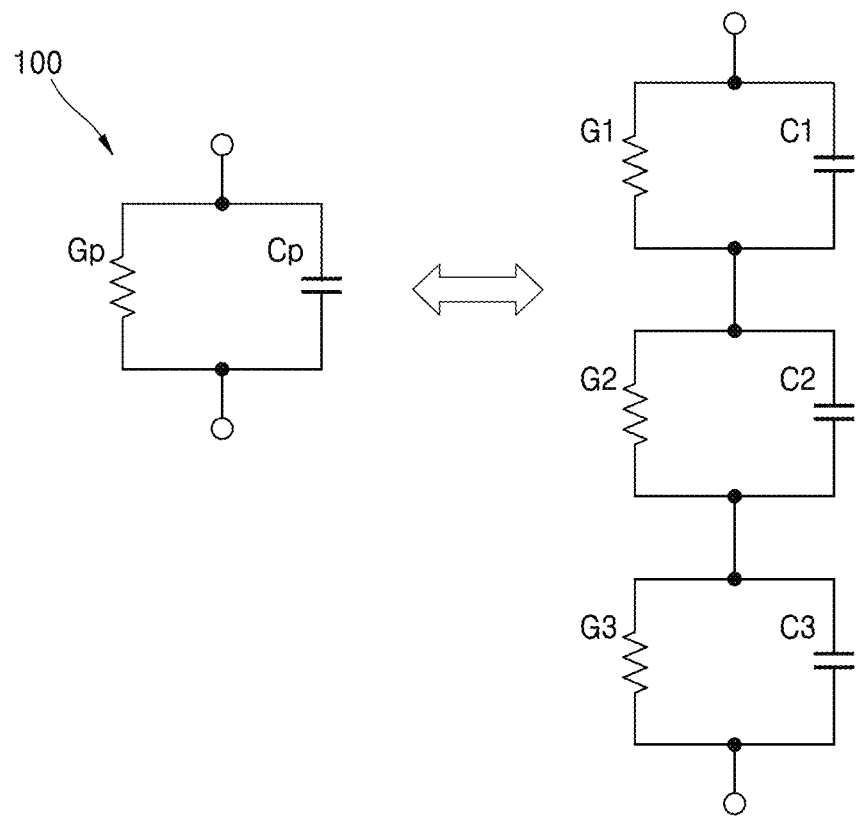
FIG. 2 shows an equivalent circuit of the capacitor of FIG. 1 according to some embodiments.

FIG. 2 shows an equivalent circuit of the capacitor 100 of FIG. 1 according to some embodiments.

A resistor-capacitor (RC) circuit on the left side shown in FIG. 2 represents the capacitor 100, and each RC circuit on the right represents the first to third dielectric films 132, 134, and 136, respectively.

For the equivalent circuit of FIG. 2, the total capacitance Cp may be expressed by the following Equation 1.

$$C_p = \frac{\begin{array}{l}C_1(G_2^2 + \omega^2 C_2^2)(G_3^2 + \omega^2 C_3^2) + C_2(G_1^2 + \omega^2 C_1^2)\\(G_3^2 + \omega^2 C_3^2) + C_3(G_1^2 + \omega^2 C_1^2)(G_2^2 + \omega^2 C_2^2)\end{array}}{\begin{array}{l}(G_1^2 + \omega^2 C_1^2)[(G_2 + G_3)^2 + \omega^2 (C_2 + C_3)^2] + \\(G_2^2 + \omega^2 C_2^2)[(G_1 + G_3)^2 + \omega^2 (C_1 + C_3)^2] + \\(G_3^2 + \omega^2 C_3^2)[(G_1 + G_2)^2 + \omega^2 (C_1 + C_2)^2] - \\(G_1^2 + \omega^2 C_1^2)(G_2^2 + \omega^2 C_2^2) - (G_2^2 + \omega^2 C_2^2)\\(G_3^2 + \omega^2 C_3^2) - (G_1^2 + \omega^2 C_1^2)(G_3^2 + \omega^2 C_3^2)\end{array}} \quad \text{[Equation 1]}$$

In Equation 1, ω is the operating angular frequency of the capacitor 100; $C_1$, $C_2$, and $C_3$ respectively are the capacitances of the first to third dielectric films 132, 134, and 136; and $G_1$, $G_2$, and $G_3$ respectively are the conductances of the first to third dielectric films 132, 134, and 136.

If the conductance $G_1$ of the first dielectric film 132 is greater than the conductances $G_2$ and $G_3$ of the second and third dielectric films 134 and 136 and the reciprocal of the reactance ($\omega C_1$, $\omega C_2$, $\omega C_3$) of each of the first to third dielectric films 132, 134, and 136 (e.g., $G_1 \gg G_2$, $G_3$, $\omega C_1$, $\omega C_2$, $\omega C_3$), the capacitance Cp of the capacitor 100 may be expressed as Equation 2 below. Here, it is preferable that the conductance $G_1$ of the first dielectric film 132 is greater than 10 times or more than the conductances $G_2$ and $G_3$ of the second and third dielectric films 134 and 136 and the reciprocal of reactance ($\omega C_1$, $\omega C_2$, $\omega C_3$) of the first to third dielectric films 132, 134, and 136.

$$C_p \approx \frac{\begin{array}{l}G_1^2[C_2(G_3^2 + \omega^2 C_3^2) + C_3(G_2^2 + \omega^2 C_2^2)] + \\C_1(G_2^2 + \omega^2 C_2^2)(G_3^2 + \omega^2 C_3^2)\end{array}}{\begin{array}{l}G_1^2[(G_2 + G_3)^2 + \omega^2(C_2 + C_3)^2] - \\(G_2^2 + \omega^2 C_2^2)(G_3^2 + \omega^2 C_3^2)\end{array}} = \quad \text{[Equation 2]}$$

$$\frac{G_1^2\left[\begin{array}{l}C_2(G_3^2 + \omega^2 C_3^2) + \\C_3(G_2^2 + \omega^2 C_2^2) + \alpha C_1(G_3^2 + \omega^2 C_3^2)\end{array}\right]}{G_1^2\left[\begin{array}{l}(G_2 + G_3)^2 + \omega^2(C_2 + C_3)^2 - \\\alpha(G_3^2 + \omega^2 C_3^2)\end{array}\right]}$$

Here, since $$\alpha \equiv \frac{(G_2^2 + \omega^2 C_2^2)}{G_1^2}$$

and $G_1 \gg G_2$, $G_3$, $\omega C_1$, $\omega C_2$, $\omega C_3$, then $$\alpha \equiv \frac{(G_2^2 + \omega^2 C_2^2)}{G_1^2} \ll 1.$$

The capacitance Cp of the capacitor 100 may be expressed as in Equation 3 below.

$$C_p \approx \frac{(C_2 + \alpha C_1)(G_3^2 + \omega^2 C_3^2) + C_3(G_2^2 + \omega^2 C_2^2)}{G_2^2 + 2G_2G_3 + (1-\alpha)G_3^2 + \omega^2 C_2^2 + 2\omega^2 C_2 C_3 + \omega^2(1-\alpha)C_3^2} \approx$$ [Equation 3]

$$\frac{(C_2)(G_3^2 + \omega^2 C_3^2) + C_3(G_2^2 + \omega^2 C_2^2)}{(G_2 + G_3)^2 + \omega^2(C_2 + C_3)^2}$$

Also, if the conductance $G_2$ of the second dielectric film 134 is greater than the conductance $G_3$ of the third dielectric film 136 (e.g., if $G_2 \gg G_3$), as shown in Equation 4 below, the capacitance Cp of the capacitor 100 converges to the capacitance $G_3$ of the third dielectric film 136 having the smallest conductance. It is preferable that the conductance $G_2$ of the second dielectric film 134 is 10 times or more than the conductance $G_3$ of the third dielectric film 136. That is, the conductance $G_2$ of the second dielectric film 134 may be 10 times greater than the conductance $G_3$ of the third dielectric film 136, and the conductance $G_1$ of the first dielectric film 132 may be 100 times greater than the conductance $G_3$ of the third dielectric film 136. However, the above is merely an example embodiment based on relative conductance G of the dielectric films, and that the relative magnitudes of the conductance may vary.

$$C_p \approx C_3 = \epsilon_0 \epsilon_r \frac{A}{t_3}$$ [Equation 4]

Consequently, when the capacitor 100 is formed by connecting dielectric films (e.g., the first, second, and third dielectric films 132, 134, and 136) having a large difference in conductance in series, the capacitance of the capacitor 100 is most affected by the capacitance of the dielectric film having the smallest conductance. For example, a difference in capacitance between the capacitance of the capacitor 100 and the capacitance of a dielectric film having the smallest conductance (for example, the third dielectric film 136) may be less than a difference in capacitance between the capacitance of the capacitor 100 and the capacitances of the remaining dielectric films (for example the first and second dielectric films 132 and 134). Thus, the capacitance of the capacitor 100 may be controlled by controlling the capacitance of a dielectric film having the smallest conductance (for example, the third dielectric film 136).

The capacitance of the capacitor 100 is also affected by the dielectric constant and the thickness of the dielectric film having the smallest conductance (for example the third dielectric film 136). For example, the dielectric constant of the dielectric film having the smallest conductance may affect the capacitance of the capacitor 100 greater than the dielectric constant of the remaining dielectric films (for example the first and second dielectric films 132 and 134), and the thickness of the dielectric film having the smallest conductance may affect the capacitance of the capacitor 100 greater than the thickness of the remaining dielectric films. In some embodiments, the thickness of the dielectric film having the smallest conductance may be about 4 nm or less. In some embodiments, the thickness of the remaining dielectric films (for example each of the first and second dielectric films 132 and 134) may be 2 nm or less. Because the remaining dielectric films may slightly affect the capacitance of the capacitor 100, it may be unnecessary to have a large thickness. Rather, in some embodiments, if the thickness is large, it may be difficult to implement a thin film capacitor.

In order to increase the capacitance of the capacitor 100, it is preferable that the dielectric constant of the dielectric film having the smallest conductance is greater than the dielectric constant of the remaining dielectric films. For example, the dielectric constant of a dielectric film having the smallest conductance may preferably be about 30 or more, and the dielectric film having the smallest conductance may include at least one of a dielectric material, a ferroelectric material, a paraelectric material, and/or an antiferroelectric material having a perovskite structure.

The capacitance of the capacitor 100 may be greater than the capacitance of the dielectric film having the smallest conductance. For example, the capacitance of the capacitor 100 may be 10% or greater than the capacitance of the dielectric layer 130 having a small conductance. The capacitance of the capacitor 100 may have a dielectric constant of 35 or more.

In order to confirm whether the capacitance of the capacitor is affected by not only the capacitance of the dielectric film but also the conductance of the dielectric film, a capacitor in which two dielectric films are arranged in series was fabricated, and the capacitance of the capacitor was measured.

Figure 3:
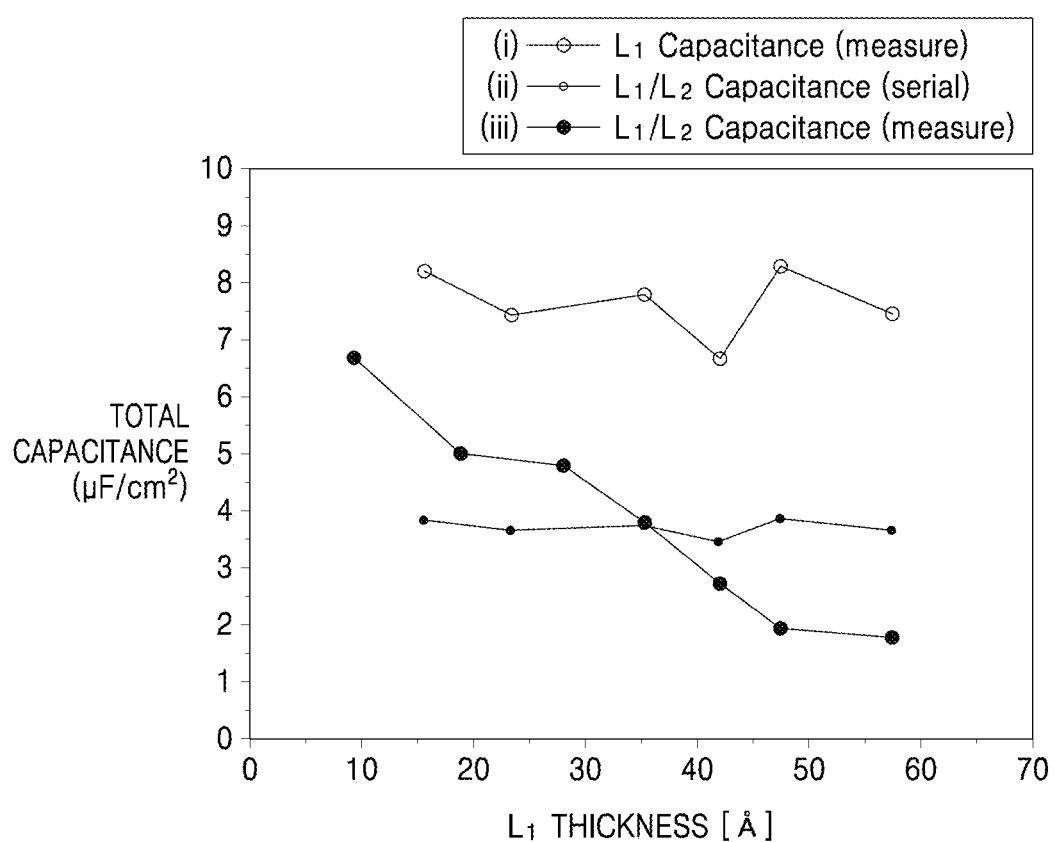
FIG. 3 is a graph showing a result of measuring capacitance according to a thickness of a dielectric film according to some embodiments.

FIG. 3 is a graph showing a result of measuring capacitance according to a thickness of a dielectric film according to some embodiments. A second dielectric film $L_2$ having a capacitance of a certain size, and a first dielectric film $L_1$, as depicted by (i) in FIG. 3, the capacitance of which slightly varies depending on the thickness, are connected in series.

If the capacitance of the capacitor is determined by the capacitances of the first and second dielectric films $L_1$, and $L_2$, the capacitance of the capacitor 100 may hardly change according to the thickness as shown by (ii) in FIG. 3. However, as shown by the results of actual measurements, it may be confirmed that the capacitance changes according to the thickness of the first dielectric film $L_1$ as shown by (iii) in FIG. 3. It may be expected that the capacitance of the capacitor may be affected not only by the capacitance of each of the dielectric films $L_1$ and $L_2$ but also by the conductance of each of the dielectric films $L_1$ and $L_2$.

Also, it may be seen that, when the thickness of the first dielectric film $L_1$ is small (for example when the thickness of the first dielectric film $L_1$ is about 3.5 nm or less) the capacitance of the capacitor increases more than the theoretically calculated capacitance. It may be also seen that, even if the thickness of the capacitor 100 is small, there is a boosting effect of the capacitance due to the conductance.

Figure 4:
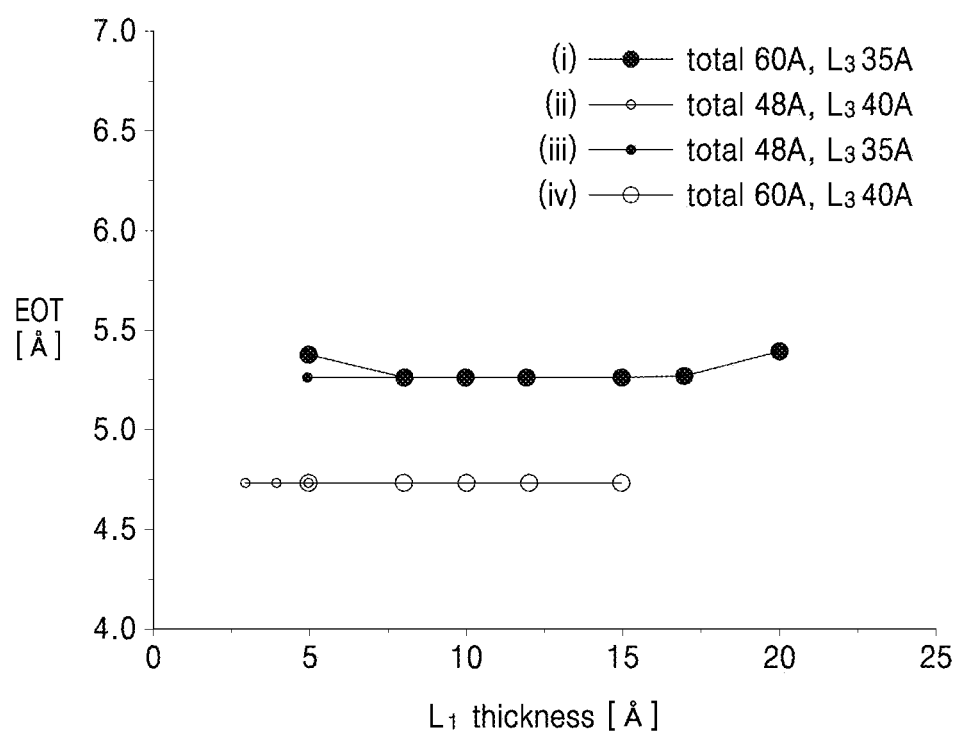
FIG. 4 is a graph showing a result of calculating an equivalent oxide thickness (EOT) according to a thickness change of a first dielectric film having a large conductance according to some embodiments.

FIG. 4 is a graph showing a result of calculating an equivalent oxide thickness (EOT) according to a thickness change of the first dielectric film $L_1$ having a large conductance, according to some embodiments. When a capacitor having a thickness of 60 Å was formed with the third dielectric film $L_3$ having the smallest conductance, the EOT was about 6.7 Å, as shown by (i) of FIG. 4, which may be, without being limited to a particular theory, a result of calculating EOT according to a thickness change of the first dielectric film $L_1$ when the thickness of the capacitor 100 is set to 60 Å and the thickness of the third dielectric film $L_3$ having the smallest conductance is set to 35 Å. According to the thickness change of the first dielectric film $L_1$, the thickness of the second dielectric film $L_2$ also complementarily changes, and the thickness of the third dielectric film $L_3$ is constant. It may be seen that, even if the thickness of the first dielectric film $L_1$ is changed, the EOT is almost constant. It may be seen that the capacitance of the capacitor is determined by the third dielectric film $L_3$ having a low conductance.

A result of measuring EOT according to a thickness change of the first dielectric film $L_1$ when the thickness of a capacitor is set to 48 Å and the thickness of the third dielectric film $L_3$ having the smallest conductance is set to 40 Å is shown by (ii) of FIG. 4. When the results represented by (i) are compared to the results represented by (ii), it may be seen that the larger the thickness ratio of the third dielectric film $L_3$ to the thickness of the capacitor, the larger the capacitance. This may denote that a thin-film capacitor may be implemented by conductance.

When a capacitor having a thickness of 45 Å was formed with the third dielectric film $L_3$ having the smallest conductance, the EOT was about 5.5 Å, as shown by (iii) of FIG. 4, which may be, without being limited to a particular theory, a result of measuring EOT according to the thickness change of the first dielectric film $L_1$ when the thickness of a capacitor is set to 60 Å and the thickness of the third dielectric film $L_3$ having the smallest conductance is set to 35 Å. A result of measuring EOT according to the thickness change of the first dielectric film $L_1$ when the thickness of a capacitor is set to 48 Å and the thickness of the third dielectric film $L_3$ having the smallest conductance may be set to 40 Å is shown by (iv) of FIG. 4. It may be seen that even if the thickness of the first dielectric film $L_1$ is changed, the EOT is almost constant, and that the capacitance of the capacitor is affected by the third dielectric film $L_3$ having the smallest conductance. When the results represented by (iii) are compared to the results represented by (iv), with regard to the thickness of the capacitor, it may be seen that the larger the thickness ratio of the third dielectric film $L_3$, the larger the capacitance.

Figures 5, 6:
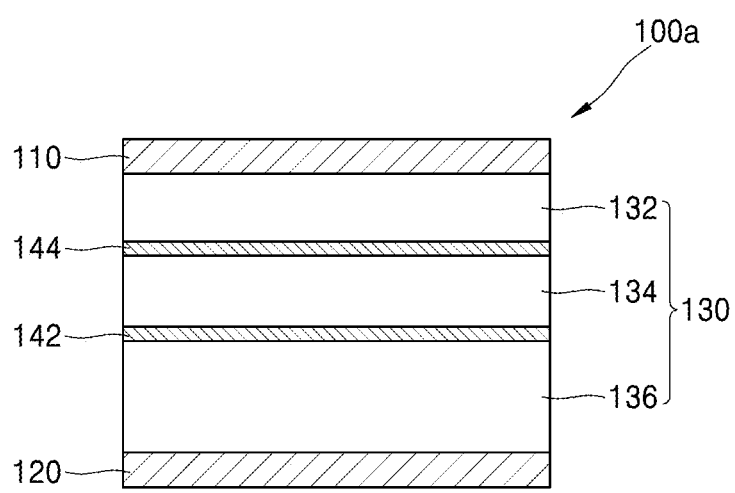
FIG. 5 shows a result of calculating a ratio of a dielectric constant of a capacitor with respect to a dielectric constant of a third dielectric film having the smallest conductance from the results of FIG. 4.
FIG. 6 is a diagram illustrating a capacitor including a plurality of insertion films according to some embodiments.

FIG. 5 shows a result of calculating a ratio of a dielectric constant of the capacitor 100 with respect to a dielectric constant of the third dielectric film $L_3$ having the smallest conductance from the results of FIG. 4. As illustrated in FIG. 5, it may be seen that the dielectric constant of the capacitor 100 is greater than that of the third dielectric film $L_3$. It may be seen that the conductance of the dielectric film induces a boosting effect of the capacitance.

FIG. 6 is a diagram illustrating a capacitor 100a including a plurality of insertion films according to some embodiments. A capacitor 100a of FIG. 6, compared to the capacitor 100 of FIG. 1, may further include a second insertion film 144 between the first dielectric film 132 and the second dielectric film 134. Like the first insertion film 142, the second insertion film 144 may include a low dielectric material, and/or may have a thickness less than twice the thickness of an atomic layer. In some embodiments, the second insertion film 144 may not act as an operation layer of the capacitor 100a. Also, in some embodiments, the second insertion film 144 may block a leakage current by changing an interface between the first dielectric film 132 and the second dielectric film 134, and/or may affect the crystal structures of the first dielectric film 132 and the second dielectric film 134 such that the crystal structures are different from each other. For example, direct contact between the second insertion film 144 and at least one of the first dielectric film 132 and/or the second dielectric film 134 may affect the growth and/or crystallization of the at least one of the first dielectric film 132 and/or the second dielectric film 134.

Because the second insertion film 144 may affect the crystal structures of the first dielectric film 132 and/or the second dielectric film 134, the first dielectric film 132 and the second dielectric film 134 may include the same material but have different physical properties. Thus, even if the first dielectric film 132 and the second dielectric film 134 include the same material, the first dielectric film 132 and the second dielectric film 134 may have physical properties, for example, conductance or capacitance, different from each other.

Figure 7:
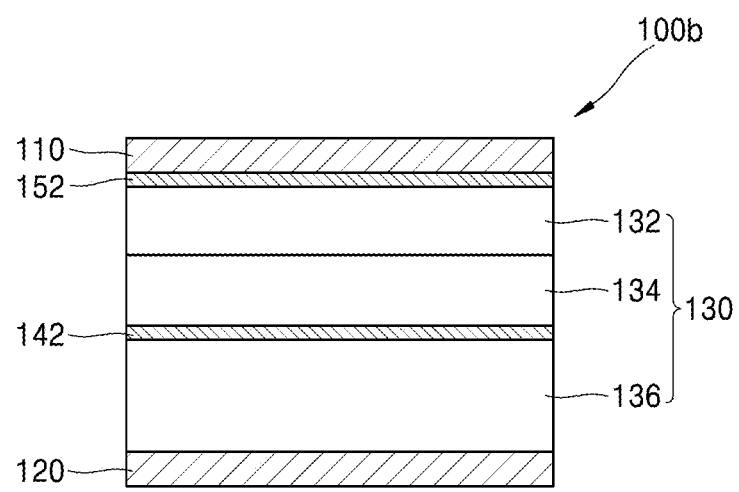
FIG. 7 is a diagram illustrating a capacitor including an interface film according to some embodiments.

FIG. 7 is a diagram illustrating a capacitor 100b including an interface film according to some embodiments. A capacitor 100b of FIG. 7, compared to the capacitor 100 of FIG. 1, may further include an interface film 152 between the first electrode 110 and the dielectric layer 130. The interface film 152 may block and/or reduce a leakage current from flowing between the first electrode 110 and the second electrode 120. For example, the interface film 152 may act as a leakage current reduction layer. In some embodiments, the interface film 152 may include $Al_2O_3$ and/or may be doped with a dopant. The interface film 152 may have a thickness of 1 nm or less. Although not shown, the interface film 152 may also be arranged between the dielectric layer 130 and the second electrode 120.

Figure 8:
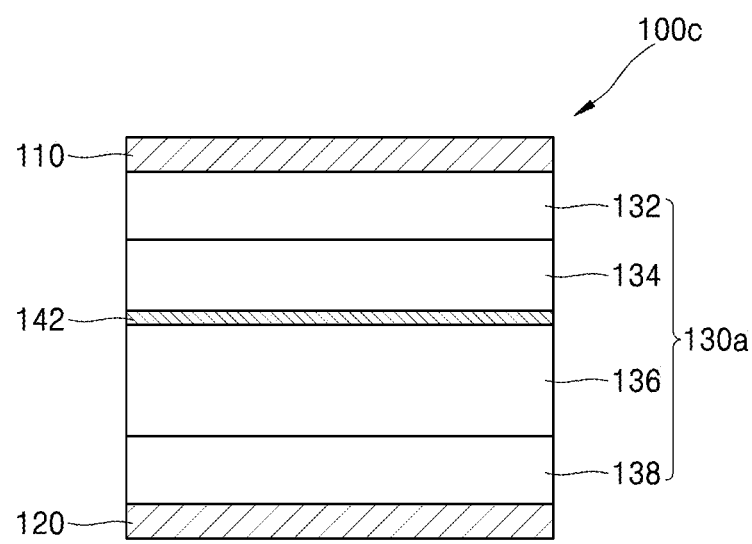
FIG. 8 is a diagram illustrating a capacitor including four unit dielectric films according to some embodiments.

FIG. 8 is a diagram illustrating a capacitor 100c including four unit dielectric films according to some embodiments. A capacitor 100c of FIG. 8, when compared to the capacitor 100 of FIG. 1, may further include a fourth dielectric film 138. The fourth dielectric film 138 may have a physical property different from those of the first to third dielectric films 132, 134, and/or 136. For example, the fourth dielectric 138 may have a different conductance or capacitance from the first to third dielectric films 132, 134, and/or 136. In some embodiments, the all of the first to fourth dielectric films 132, 134, 136, and 138 may have different physical properties to each other. When the fourth dielectric film 138 is arranged to directly contact the third dielectric film 136, the fourth dielectric film 138 may include a material different from that of the third dielectric film 136, but the present embodiment is not limited thereto. Although not shown, an insertion film may further be arranged between the fourth dielectric film 138 and the third dielectric film 136, and the fourth dielectric film 138 may include the same material as the third dielectric film 136, but may have different physical properties. The number of dielectric films may vary depending on applications.

Additionally, though not illustrated, the capacitor 100c may further include one and/or both of the second insertion film 144 and/or the interface film 152 as depicted in FIGS. 6 and 7, respectively.

Figure 9:
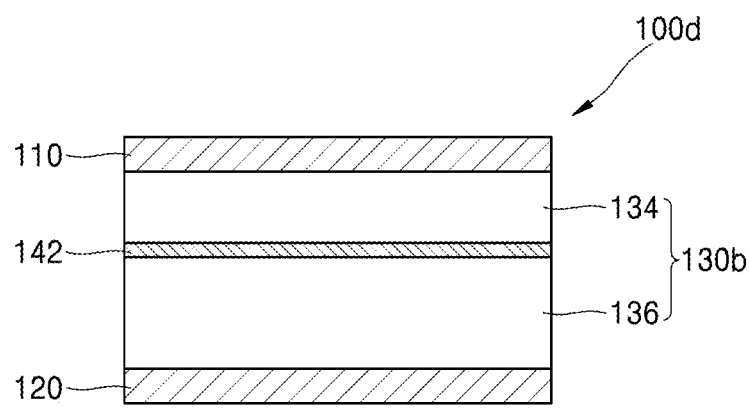
FIG. 9 is a diagram illustrating a capacitor including two dielectric films according to some embodiments.

FIG. 9 is a diagram illustrating a capacitor 100d including two dielectric films according to some embodiments. A capacitor 100d of FIG. 9, compared to the capacitor 100 of FIG. 1, may include two dielectric films. For example, the capacitor 100d may include the second and third dielectric films 132 and 136, and the insertion film 142 may be arranged between the second and third dielectric films 132 and 136. The second and third dielectric films 132 and 136 may include the same material, but may have physical properties different from each other, for example, because of the insertion film 142. Due to the difference in conductance according to some embodiments, the capacitance of a capacitor is converged to the capacitance of a dielectric film having a small conductance, and thus, a unit dielectric film 130 of the capacitor may be two.

Figure 10:
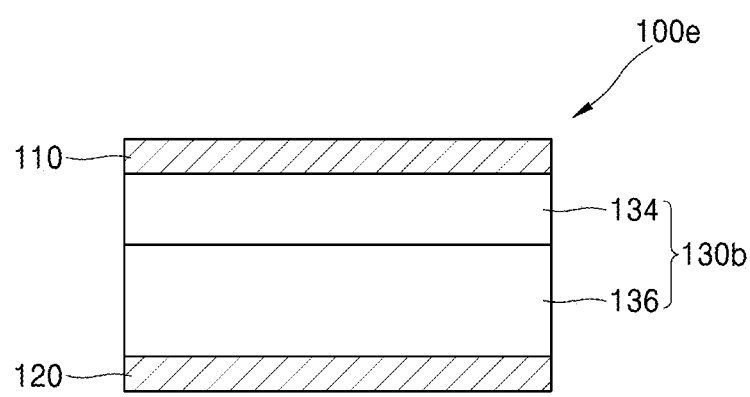
FIG. 10 is a diagram illustrating a capacitor without an insertion film according to some embodiments.

FIG. 10 is a diagram illustrating a capacitor 100e without an insertion film according to some embodiments. A capacitor 100e of FIG. 10, compared to the capacitor 100d of FIG. 9, may not include an insertion film. In this case, it is preferable that the second dielectric film 134 and the third dielectric film 136 include different materials from each other such that the second dielectric film 134 and the third dielectric film 136 have different physical properties. If the unit dielectric film 130 includes different materials from each other, the capacitor 100 may not include an additional insertion film 142, and the number of unit dielectric films 130 may be three or more.

Figure 11:
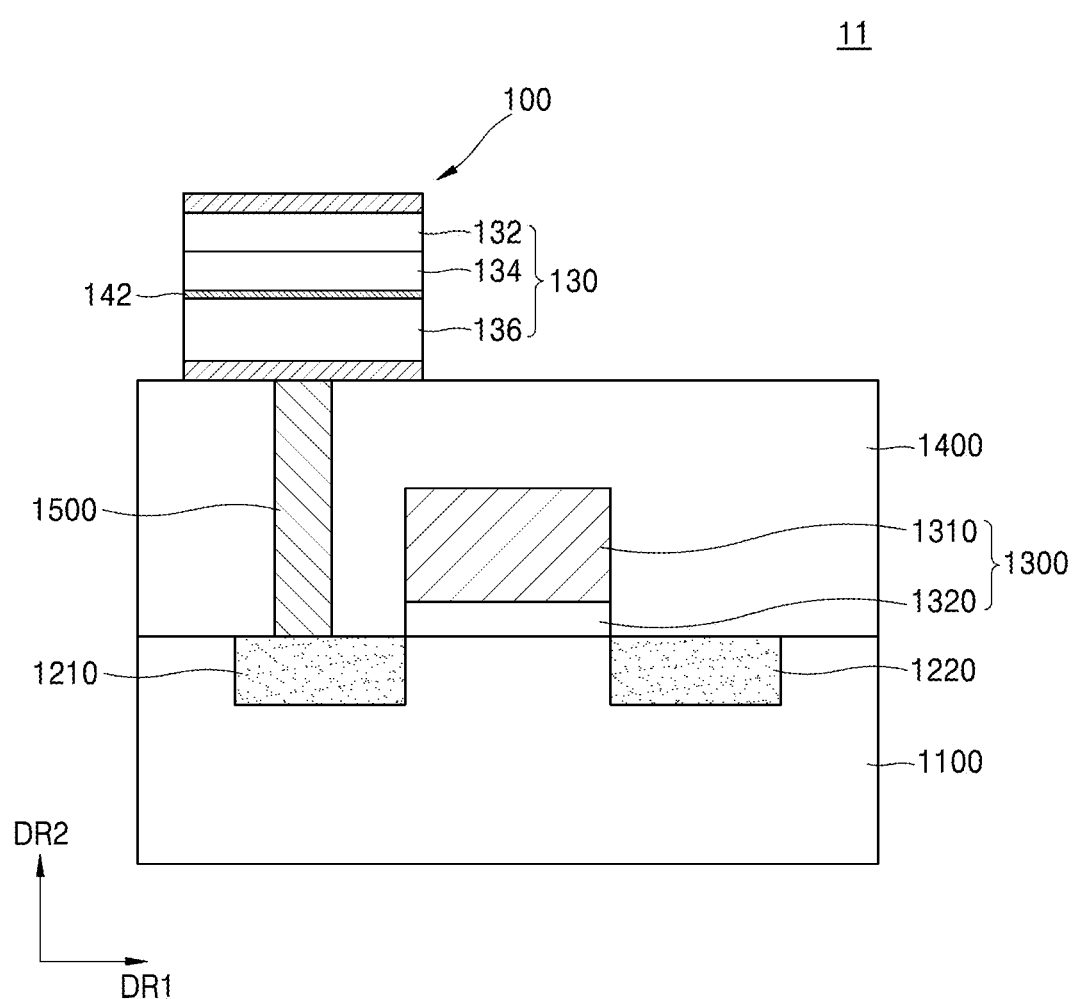
FIG. 11 is a cross-sectional view of a semiconductor device according to some embodiments.

FIG. 11 is a cross-sectional view of a semiconductor device 11 according to some embodiments. For brevity of explanation, descriptions substantially the same as those given with reference to FIG. 1 will be omitted.

Referring to FIG. 11, the semiconductor device 11 may include a substrate 1100, a gate structure 1300, an interlayer insulating layer 1400, a contact 1500, and a capacitor 100 may be provided. The substrate 1100 may include a semiconductor substrate. For example, the substrate 1100 may include a silicon substrate, a germanium substrate, or a silicon-germanium substrate. The substrate 1100 may be a channel.

A first source/drain region 1210 and a second source/drain region 1220 may be provided in the substrate 1100. The first and second source/drain regions 1210 and 1220 may be separated from each other in a first direction DR1 parallel to an upper surface of the substrate 1100. For example, the first source/drain region 1210 and the second source/drain region 1220 may each be on a side of the channel. In some embodiments, the first and second source/drain regions 1210 and 1220 may be formed by implanting impurities into the substrate 1100.

The gate structure 1300 may be provided on the substrate 1100. The gate structure 1300 may be provided between the first and second source/drain regions 1210 and 1220 and/or on the channel. The gate structure 1300 may include a gate electrode 1310 and a gate insulating layer 1320. The gate electrode 1310 may include a conductive material. For example, the gate electrode 1310 may include a metal or polysilicon.

The gate insulating layer 1320 may be disposed between the gate electrode 1310 and the substrate 1100. The gate insulating layer 1320 may electrically isolate the substrate 1100 from the gate electrode 1310. The gate insulating layer 1320 may include a dielectric material. For example, the gate insulating layer 1320 may include a Si oxide (e.g., $SiO_2$), an Al oxide (e.g., $Al_2O_3$), or a high dielectric material (e.g., $HfO_2$). For example, in some embodiments, the gate insulating layer 1320 may include an oxide of the substrate 1100.

The interlayer insulating layer 1400 may be provided on the substrate 1100 to cover the gate structure 1300. The interlayer insulating layer 1400 may include an insulating material. For example, the interlayer insulating layer 1400 may include a Si oxide (e.g., $SiO_2$), an Al oxide (e.g., $Al_2O_3$), and/or a high dielectric material (e.g., $HfO_2$). In some embodiments, the interlayer insulating layer 1400 may be omitted. The substrate 1100, the first source/drain region 1210, the second source/drain region 1220, and the gate structure 1300 may constitute a transistor.

The capacitor 100 may be connected to one of the first source/drain region 1210 or the second source/drain region 1220, and, in some embodiments provided on the interlayer insulating layer 1400. The capacitor 100 is depicted as the capacitor 100 illustrated in FIG. 1, but is not limited thereto, and the capacitors 100a, 100c, 100d, and 100e described above may also be applied. Because the capacitance of the capacitor 100 converges to the capacitance of the dielectric film having the smallest conductance, the capacitance characteristic of the capacitor is improved.

The contact 1500 may be provided between the first electrode 110 and the first source/drain region 1210. The contact 1500 may penetrate through the interlayer insulating layer 1400. The contact 1500 may electrically connect the capacitor 100 and the first source/drain region 1210 to each other. For example, in some embodiments, the contact 1500 may electrically connected the first electrode 110 or the second electrode 120 to the first source/drain region 1210. The contact 1500 may include a conductive material (e.g., a metal). Though not illustrated, in the case wherein the interlayer insulating layer 1400 is not included in the semiconductor device 11, the capacitor 100 may be directly connected to the first source/drain region 1210. In this case, the first electrode 110 and/or second electrode 120, as depicted in FIG. 1, may act as a contact between the capacitor 100 and the first source/drain region 1210.

The present disclosure may provide a capacitor having improved leakage current characteristics and capacitance characteristics.

The present disclosure may also provide a semiconductor device including a capacitor having improved leakage current characteristics and capacitance characteristics.

However, the inventive concepts are not limited to the above disclosure.

It should be understood that the example embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims.

What is claimed is:

1. A capacitor comprising:
a first electrode;
a plurality of dielectric films on the first electrode in a sequential series, the plurality of dielectric films having different conductances from each other; and
a second electrode on the plurality of dielectric films,
wherein the plurality of dielectric films are configured such that
the capacitor has a first capacitance,
a capacitance across a dielectric film having the smallest conductance, among the plurality of dielectric films, is a second capacitance,
the smallest conductance is less than or equal to a tenth (1/10) a conductance of each of a remainder of the plurality of dielectric films, and
a difference in capacitance between the first capacitance and the second capacitance is less than a difference in capacitance between the first capacitance and a capacitance of each of the remainder of the plurality of dielectric films.

2. The capacitor of claim 1, wherein a dielectric constant of the dielectric film having the smallest conductance is greater than a dielectric constant of at least one of the remainder of the plurality of dielectric films.

3. The capacitor of claim 1, wherein a dielectric constant of the dielectric film having the smallest conductance among the plurality of dielectric films is 30 or more.

4. The capacitor of claim 1, wherein the dielectric film having the smallest conductance includes at least one of a perovskite structure, a ferroelectric material, a paraelectric material, or an antiferroelectric material.

5. The capacitor of claim 1, wherein the capacitance of the capacitor is 10% or greater than the second capacitance across the dielectric film having the smallest conductance among the plurality of dielectric films.

6. The capacitor of claim 1, wherein a thickness of the dielectric film having the smallest conductance has a greater effect on the capacitance of the capacitor than a thickness of a dielectric film having the largest conductance among the plurality of dielectric films.

7. The capacitor of claim 1, wherein a thickness of the dielectric film having the smallest conductance is 4 nm or less.

8. The capacitor of claim 1, wherein a thickness of a dielectric film having the largest conductance among the plurality of dielectric films is 2 nm or less.

9. The capacitor of claim 1, wherein a thickness of the capacitor is 5 nm or less.

10. The capacitor of claim 1, wherein a difference in conductance between a dielectric film having a largest conductance and the dielectric film having the smallest conductance is 100 times or more.

11. The capacitor of claim 1, further comprising:
a first insertion film,
wherein the plurality of dielectric films include a first, second, and third dielectric film, and
the first insertion film is between the second and the third dielectric film.

12. The capacitor of claim 11, wherein the second and the third dielectric films directly contact the first insertion film.

13. The capacitor of claim 11, wherein a thickness of the first insertion film is less than twice a thickness of an atomic layer included in the first insertion film.

14. The capacitor of claim 11, wherein the second and the third dielectric films comprise the same material.

15. The capacitor of claim 11, wherein the first and the second dielectric films are in direct contact and include different materials from each other.

16. The capacitor of claim 11, further comprising:
a second insertion film between the first and the second dielectric films.

17. A semiconductor device comprising:
a transistor; and
the capacitor according to claim 1 electrically connected to the transistor.

* * * * *